US007120060B2

(12) United States Patent
Pekny

(10) Patent No.: US 7,120,060 B2
(45) Date of Patent: Oct. 10, 2006

(54) MEMORY DEVICE WITH NON-VOLATILE REFERENCE MEMORY CELL TRIMMING CAPABILITIES

(75) Inventor: Theodore T. Pekny, Campbell, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/899,892

(22) Filed: Jul. 27, 2004

(65) Prior Publication Data

US 2005/0002239 A1 Jan. 6, 2005

Related U.S. Application Data

(60) Continuation of application No. 10/230,766, filed on Aug. 29, 2002, now abandoned, which is a division of application No. 09/818,957, filed on Mar. 27, 2001, now Pat. No. 6,466,480.

(51) Int. Cl.
*G11C 11/34* (2006.01)
(52) U.S. Cl. .............................. 365/185.2; 365/185.22; 365/185.24
(58) Field of Classification Search ......... 365/185.2 O, 365/185.22 X, 185.24 X, 185.21, 185.19
See application file for complete search history.

(56) References Cited

U.S. PATENT DOCUMENTS

| 5,608,679 | A | | 3/1997 | Mi et al. |
| 5,650,966 | A | | 7/1997 | Cleveland et al. |
| 5,737,265 | A | * | 4/1998 | Atwood et al. ........ 365/185.03 |
| 5,764,568 | A | | 6/1998 | Chevallier |
| 5,790,453 | A | | 8/1998 | Chevallier |
| 5,822,250 | A | | 10/1998 | Krzentz |
| 5,828,601 | A | | 10/1998 | Hollmer et al. |
| 5,982,666 | A | | 11/1999 | Campardo |
| 6,078,518 | A | | 6/2000 | Chevallier |
| 6,118,701 | A | | 9/2000 | Uekubo |
| 6,205,056 | B1 | | 3/2001 | Pan et al. |
| 6,269,022 | B1 | | 7/2001 | Ra |
| 6,278,634 | B1 | | 8/2001 | Ra |
| 6,614,292 | B1 | * | 9/2003 | Chung et al. ............... 327/536 |

* cited by examiner

*Primary Examiner*—VanThu Nguyen
(74) *Attorney, Agent, or Firm*—Leffert Jay & Polglaze, P.A.

(57) ABSTRACT

A non-volatile memory device comprising a primary memory array, at least one non-volatile reference memory cell and sense circuitry. The primary memory array has a plurality of memory cells. The sense circuitry is used to monitor the logic state of the memory cells. In addition, the memory device has an input connection to couple an external reference current to the sense circuitry to be used during the programming of the reference memory cell.

19 Claims, 3 Drawing Sheets

MEMORY DEVICE WITH NON-VOLATILE REFERENCE MEMORY CELL TRIMMING CAPABILITIES

RELATED APPLICATION

This is a continuation application of U.S. patent application Ser. No. 10/230,766, filed Aug. 29, 2002, now abandoned tiled "Memory Device with Non-Volatile Reference Memory Cell Trimming Capabilities", which is a divisional application of U.S. patent application Ser. No. 09/818,957 filed Mar. 27, 2001, now U.S. Pat. No. 6,466,480 titled "Method and Apparatus For Trimming Non-Volatile Memory Cells" and commonly assigned, the entire contents of which is incorporated herein by reference.

TECHNICAL FIELD OF THE INVENTION

The present invention relates generally to non-volatile memories and in particular the present invention relates to trimming non-volatile reference memory cells.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents. Computers often contain a small amount of read-only memory (ROM) that holds instructions for starting up the computer. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array that includes a large number of memory cells arranged in a row and column fashion. Each memory cell includes a floating gate field-effect transistor capable of holding a charge. The cells are usually grouped into erasable blocks. Each of the memory cells can be electrically programmed in a random basis by charging the floating gate. The charge can be removed from the floating gate by an erase operation. Thus, the data in a cell is determined by the presence or absence of the charge in the floating gate.

To program a memory cell, a high positive voltage Vg is applied to the control gate of the cell. In addition, a moderate positive voltage is applied to the drain (Vd) and the source voltage (Vs) and the substrate voltage (Vsub) are at ground level. These conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to reduce the effective threshold voltage of the cell as compared to a cell that has not been programmed. A programmed non-volatile memory cell is said to be at a logic level of "0".

In flash memories, blocks of memory cells are erased in groups. This is achieved by putting a negative voltage on the word lines of an entire block and coupling the source connection of the entire block to Vcc (power supply), or higher. This creates a field that removes electrons from the floating gates of the memory elements. In an erased state, the memory cells can be activated using a lower control gate voltage. An erased non-volatile memory cell is said to be at a logic level of "1".

Non-volatile memory systems, including flash memory systems, use a variety of sense amplifiers to verify the state of memory cells in a memory array. Verification of a non-volatile memory cell is accomplished by applying a potential to the control gate of the cell to be verified and then using a sense amplifier to compare a current generated by the cell with a known current from a reference cell. The reference cell is a non-volatile memory cell or bit that has a predefined charge that is set or trimmed by the manufacture of the memory to produce a specific reference current in response to a known gate voltage. The sense amplifier determines whether the memory cell to be verified draws more or less current than the reference current. By doing this, the sense amplifier determines if the memory cell is in a programmed state or an erased state.

The reference cell or cells are pre-programmed by the memory manufactures. The time needed to program these cells to a desired voltage threshold (Vt) can be significant. Moreover, the longer it takes to program the cells the less memory devices can be produced for sale. Therefore, the longer the period of time needed to program reference cells, the more the memory device costs to make.

For the reasons stated above, and for other reasons stated below which will become apparent to those skilled in the art upon reading and understanding the present specification, there is a need in the art for an improved method of pre-programming reference cells.

SUMMARY OF THE INVENTION

The above-mentioned problems with non-volatile memory devices and other problems are addressed by the present invention and will be understood by reading and studying the following specification.

In one embodiment, a non-volatile memory device comprises a primary memory array, at least one non-volatile reference memory cell and sense circuitry. The primary memory array has a plurality of memory cells. The sense circuitry is used to monitor the logic state of the memory cells. In addition, the memory device has an input connection to couple an external reference current to the sense circuitry to be used during the programming of the reference memory cell.

In another embodiment, a flash memory device is disclosed. The flash memory device includes a primary array, one or more flash memory cells and a sense amplifier for each flash reference memory cell. The primary memory array has a plurality of memory cells. The one or more flash reference memory cells are used to verify the logic state of the plurality of memory cells in the primary array. Each sense amplifier has a first input that is adapted to receive a bitline current from an associated flash reference memory cell during a trimming operation of the associated flash reference memory cell. Each sense amplifier has a second input that is adapted to receive an external reference current from an external program reference tester. Each sense amplifier further has an output that is coupled to the external reference program tester, wherein the output of each sense amplifier is used by the external program reference tester to verify the program status of an associated flash memory cells during the trimming operation.

In yet another embodiment, a non-volatile memory device is disclosed. The non-volatile memory device comprises a primary memory array of non-volatile memory cells, one or more non-volatile reference memory cells, control circuitry and a sense amplifier for each non-volatile reference memory cell. The one or more non-volatile reference memory cells are adapted to provide a voltage threshold (Vt) level that is used in determining the logic state of the non-volatile memory cells in the memory array. The control circuitry is used to control memory operations of the memory array and one or more non-volatile reference cells. The control circuitry is adapted to receive external trimming commands from an external reference program tester, wherein in response to the external trimming commands the control circuitry performs trimming operations on the one or more non-volatile reference memory cells. Each sense amplifier has a first input that is adapted to receive a bitline current from an associated non-volatile reference cell during a trimming operation. Each sense amplifier has a second input that is adapted to receive an external reference current during a trimming operation. Each sense amplifier further has an output to output a logic level based on the comparison of an associated bitline current with an associated reference current during a trimming operation.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention reduces the test time required to trim reference cells to a specific threshold voltage by shortening a verify step with the use of internal sense amplifiers in a memory device. To better understand the present invention, further background is first provided.

Figure 1:
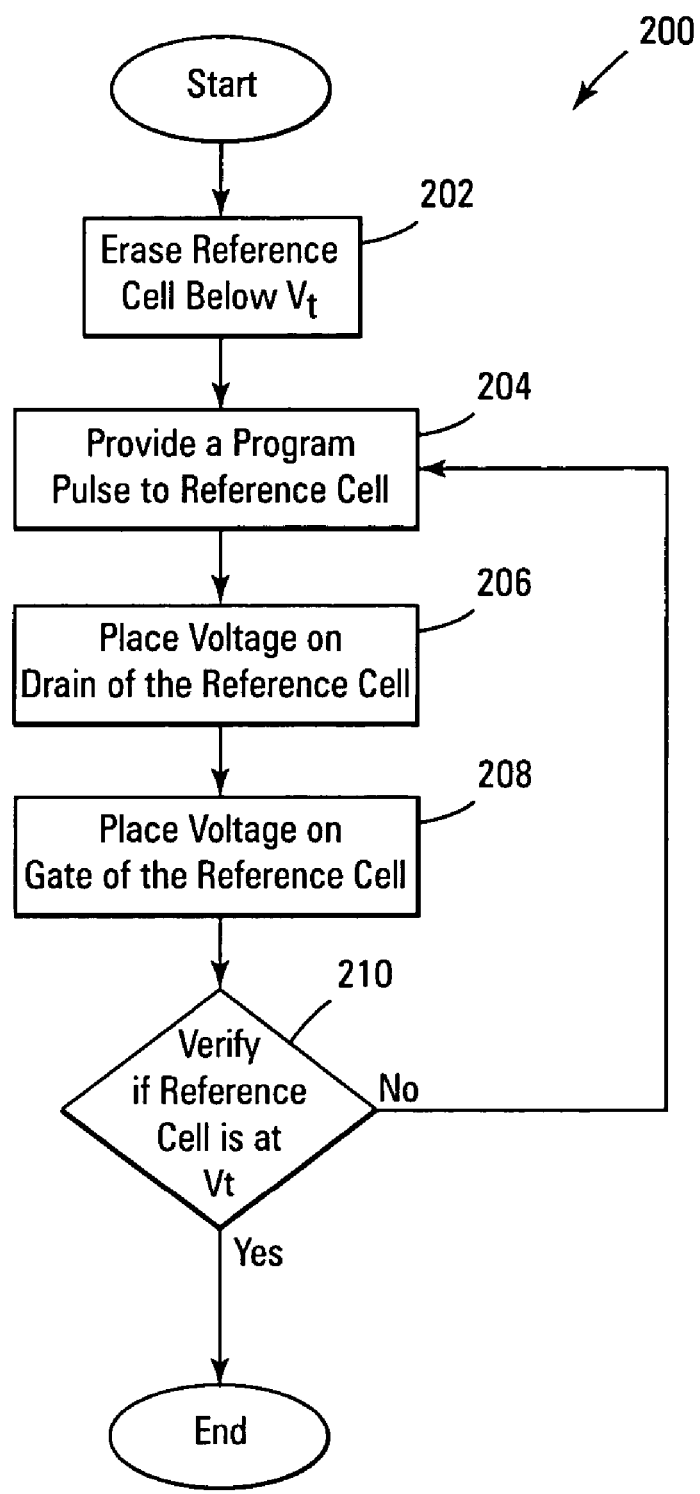
FIG. 1 is a flow chart illustrating the pre-programming of a reference cell of the prior art.

Referring to FIG. 1, a flow chart of a traditional method of trimming a reference cell (200) is illustrated. A reference cell is trimmed by first erasing the reference cell below the desired Vt (202). A program pulse is then applied to the reference bit or cell (204) to store charge on the cell. A bitline access mode is then applied to the reference cell. The bitline access mode is a test mode that places a voltage, i.e. 1 volt, on the drain of the reference cell (206) and a voltage on the control gate of the reference cell (208). A tester portable memory unit (pmu) is then used to measure the current and verify if a reference cell (210) has reached the desired Vt. If the target Vt has not been reached on the reference cell, another program pulse is applied to the reference cell (204). Once again, a voltage is then applied to the drain of the reference cell (206) and to the control gate of the reference cell (208). The tester pmu once again measures the current and verifies if the reference cell (210) has reached the Vt. This process is repeated until it is verified that a sufficient charge has been stored on the floating gate of the reference cell.

The time required to verify a reference cell with a tester pmu takes a long period of time relative to the time needed to program the reference cell. Activating the tester pmu, to measure the current of the reference cell, can take up to 100 ms. Moreover, it can take seconds to complete verification if repeated cycles of applying program pulses to the reference cell and measuring for Vt is required. Although a tester pmu or reference program tester is used in the present invention, a bitline access mode is not used to measure the current of the reference cell to verify VT, thus no test time is wasted on tester pmu activation for each verify cycle.

Figure 2:
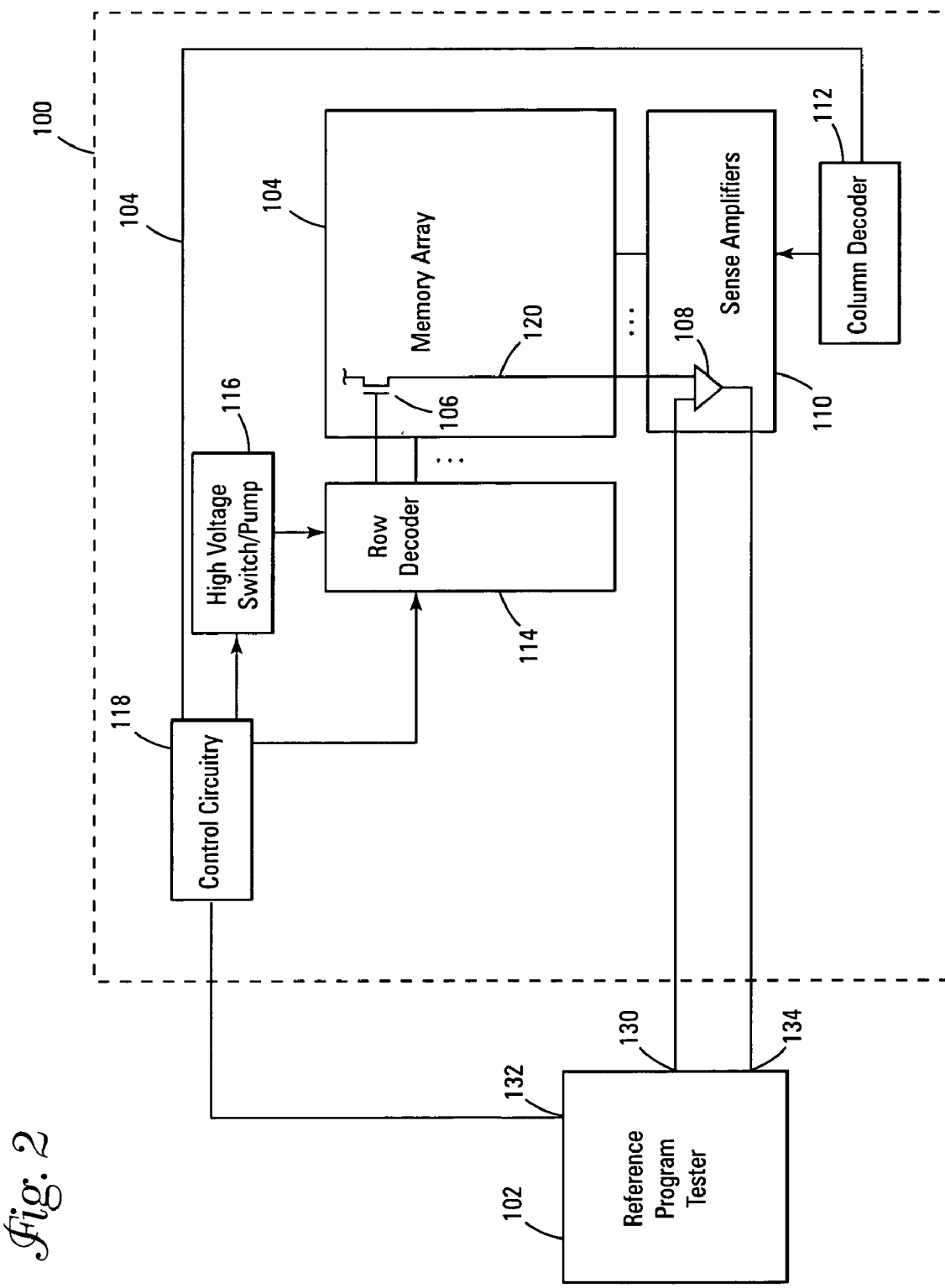
FIG. 2 is a block diagram of a memory device of an embodiment of the present invention.

Referring to FIG. 2, one embodiment of the present invention is illustrated. FIG. 2 is a simplified illustration of the relevant elements of the present invention. As shown, a reference program tester or external tester equipment 102 is coupled to a memory device 100 to supply a reference current to an input of sense amplifier 108 in a circuit of sense amplifiers 110. The reference program tester 102 has an input 134 that is coupled to the output of the sense amplifier 108 to verify an output signal of the sense amplifier 108. Although, FIG. 2 illustrates the reference program tester 102 being directly coupled to the output of the sense amplifier 108, it will be understood in the art that other elements of a non-volatile memory device (i.e. I/O buffer, or data lines) may be coupled between the test circuit and the output of the sense amplifier and that the present invention is not limited to a direct connection of the reference program tester 102 to the sense amplifier 108.

The reference program tester 102 further has a command output(s) 132 that is coupled to control circuitry 118 of the memory device 100 to provide external commands to the control circuitry 118. The control circuitry 118 controls erase, program and other memory operations of the memory device 100. A high voltage switch/pump 116 is also shown to provide a voltage source for the program pulses applied to the memory cells. A reference cell or reference memory cell 106 is illustrated in the memory array 104. A drain of the reference cell 106 is coupled to another input of the sense amplifier 108 by a bitline 120. The memory device 100 is further shown as having a column decode circuit 112 and a row decode circuit 114. Although, FIG. 2 is shown as only having one reference cell, it will be understood in the art that a memory device may have more than one reference cell and that the present invention is not limited to one reference cell. Further, the reference cells may be located in a separate "mini" array and not located with the primary data array.

Figure 3:
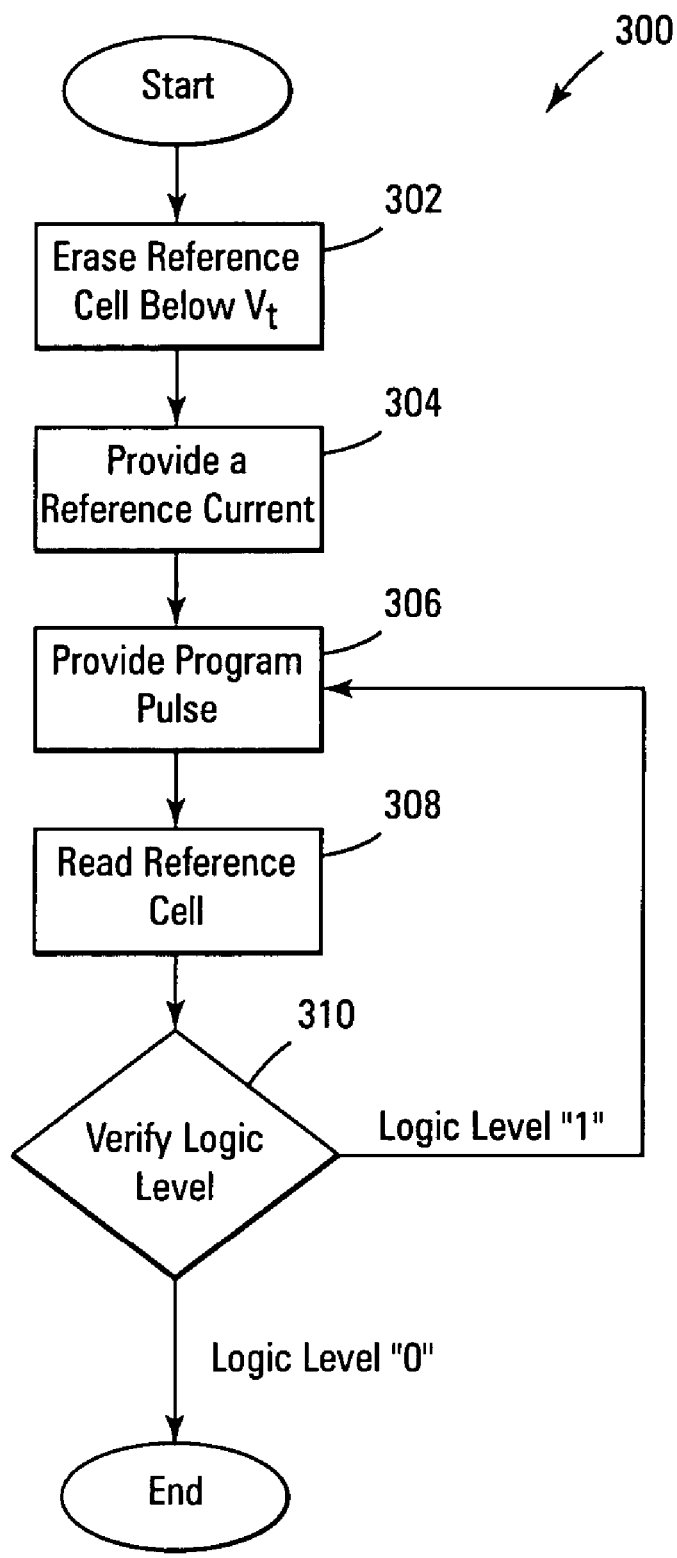
FIG. 3 is a flow chart illustrating the pre-programming of a reference cell of one embodiment the present invention.

Referring to FIG. 3, a flow chart of a method of trimming a reference cell (300) of the present invention is illustrated. The reference cell 106 is first erased below a desired Vt (302) by the control circuitry 118. A reference current output 130 of the reference program tester 102 then supplies a reference current to an input of sense amplifier 108. The reference current level is equal to a current level that would be indicative of a current supplied by an accessed memory cell having the desired Vt. The reference current is supplied to the sense amplifier 108 during the remainder of the trimming cycle. A low level program pulse is then applied to the control gate of the reference cell 106 (306) to gently charge up the reference cell 106. The low level program pulse is used to add a small charge to the reference cell. In one embodiment, the low level program pulse includes applying approximately 8 volts to the control gate of the reference cell and approximately 5.4 volts to the drain of the reference cell while the source and the substrate of the reference cell is at ground level. This low level program pulse is applied for a period of approximately 1 ms. The reference cell 106 is then read (308). As known to those in the art, a cell is read by providing a predetermined access voltage to a wordline coupled to a control gate of the cell. For, example, in one embodiment, an access voltage of approximately 3.9 volts is used. In another embodiment, an access voltage of approximately 3.4 volts is used. In response to the access voltage, the cell provides a cell or bit current in a bitline that is coupled to a drain of the cell. The cell or bit current in the bitline is indicative of the charge stored on the cell or bit.

Reading or accessing the reference cell provides a cell current from the reference cell 106 to the other input of the sense amplifier 108. The sense amplifier 108 then compares the cell current supplied by the reference cell 106 to the reference current supplied by the reference program tester 102 (310). The sense amplifier outputs a logic level of a "1" or a logic level of a "0". In one embodiment of the present invention, an output of a logic level 1 indicates the reference cell is below the desired Vt and that an additional program pulse is needed and an output of a logic level 0 indicates the reference cell exceeds the desired Vt. In this embodiment, when the output transitions from a logic level 1 to a logic level 0, the trimming cycle is complete. In another embodiment of the present invention, an output of a logic level 0 indicates the reference cell is below the desired Vt and that an additional program pulse is needed and an output of a logic level 1 indicates the reference cell exceeds the desired Vt. In this embodiment, when the output transitions from a logic level 0 to a logic level 1, the trimming cycle is complete. Verifying with the use of internal sense amplifiers of a memory device can be done in approximately 200 ns per cycle. That is, it only takes about 200 ns to verify the state of a reference cell after a program pulse has been applied.

Unlike the prior art method of verifying a reference cell, the present invention does not directly measure the reference current but monitors the logic output of the memory device containing the reference cell. That is, the present invention verifies a reference cell when the reference cell transitions from a memory cell having a voltage level below the desired Vt to a memory cell having a voltage level above the desired Vt as indicated by the logic output. The resulting voltage level on the reference cell provides a current that is above the reference current. The difference in the resulting voltage level on the reference cell is determined by the strength of the program pulse applied. That is, the lower the strength of the program pulse, the less charge will be stored on the floating gate of the memory cell and the closer the voltage level of the reference memory cell will be to the desired Vt level once the logic output changes. A longer programming pulse will program the reference cell with less programming pulses, but shorter programming pulses provide for a more accurate trim.

CONCLUSION

A method and apparatus for trimming a non-volatile memory cell has been disclosed. One method comprising, erasing the memory cell below a desired voltage threshold (Vt) level, applying a program pulse to the memory cell, reading the memory cell, comparing a current conducted by the memory cell with an externally provided reference current using a sense amplifier that is internal to a memory device that contains the memory cell, producing a digital output based on the comparison of the currents and applying successive program pulses until the digital output changes from one logic state to another.

Although specific methods and embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for trimming a flash reference cell located in a memory array of a memory device, the method comprising:
    erasing the flash reference cell below a desired Vt level;
    applying a first program pulse having a predetermined voltage level and is applied for a predetermined period of time to the flash reference cell to increase a floating gate charge of the flash reference cell;
    accessing the flash reference cell to create a cell current in a bitline coupled to a drain of the reference cell;
    comparing, with a sense amplifier, the cell current with an externally provided constant reference current, wherein the constant reference current is indicative of a desired memory cell current; and
    applying further program pulses to the flash reference cell, while maintaining the constant reference current, when the cell current is less than the reference current until a digital output of the sense amplifier changes state to indicate that the flash reference cell is programmed to a desired level, each further program pulse having the predetermined voltage level and is applied for the predetermined period of time without change in the predetermined voltage level or predetermined period of time from the first program pulse such that all program pulses experienced by the flash reference cell are at the predetermined voltage level and for the predetermined period of time.

2. The method of claim 1 wherein the reference current is supplied by an external tester.

3. The method of claim 1 wherein the digital output is a logic level of 1 when the cell current is less than the reference current and a logic level of 0 when the cell current is greater than the reference current.

4. The method of claim 3 wherein the program pulses are applied to the flash reference cell until the digital output of the sense amplifier turns from the logic level 1 to the logic level 0.

5. A method for trimming a reference memory cell that comprises a control gate, a drain, and a source and is located in a memory array of a memory device, the method comprising:
    erasing a floating gate of the reference memory cell to a level such that the reference memory cell is turned off when a predetermined voltage is applied to a control gate of the reference memory cell;

applying a constant external reference current to a sense amplifier, wherein the sense amplifier is internal to the memory device;

providing a first program pulse having a predetermined voltage level and applied for a predetermined period of time to the reference memory cell to increase a charge on the floating gate of the reference memory cell;

coupling the predetermined voltage to the control gate;

comparing a digitline current provided by the reference memory cell with the constant reference current using the sense amplifier; and providing additional program pulses to the reference memory cell while maintaining the constant external reference current on the sense amplifier until the digitline current is less than the reference current wherein each additional program pulse has the predetermined voltage level and is applied for the predetermined period of time without change in the predetermined voltage level or predetermined period of time from the first program pulse such that all program pulses experienced by the flash reference cell are at the predetermined voltage level and for the predetermined period of time.

6. The method of claim 5 wherein the reference current comes from an external tester equipment coupled to the memory device.

7. The method of claim 6 wherein the external tester equipment monitors a digital output of the memory device in determining if the digitline current is less than the reference current.

8. The method of claim 5 wherein the additional program pulses include an 8 volt pulse to the control gate and a 5.4 volt pulse to the drain.

9. The method of claim 8 wherein and further including the source at ground level.

10. The method of claim 8 wherein the additional program pulses are applied for a period of 1 ms.

11. A method for trimming non-volatile reference bits located in a memory array of a memory device, the method comprising:

erasing each non-volatile reference bit below a desired voltage threshold;

applying a first low level program pulse having a predetermined voltage level and applied for a predetermined period of time to each non-volatile reference bit;

coupling a predetermined access voltage to control gates of each non-volatile reference bit to create a bit current in associated bitlines coupled to each non-volatile reference bit;

applying a constant reference current to the memory device from a source that is external to the memory device;

comparing the constant external reference current to the bit currents in each of the bitlines with sense amplifiers of the memory device; and applying additional program pulses to reference bits coupled to bitlines having bit current levels less than the reference current while maintaining the constant external reference current to the sense amplifiers wherein each additional program pulse has the predetermined voltage level and is applied for the predetermined period of time without change in the predetermined voltage level or predetermined period of time from the first program pulse such that all program pulses experienced by the flash reference cell are at the predetermined voltage level and for the predetermined period of time.

12. The method of claim 11 wherein the external reference current is provided by external tester equipment.

13. The method of claim 11 wherein the memory device provides a digital output of a logic level 1 or a logic level 0 based on comparing the external reference current with the bit currents.

14. The method of claim 13 wherein the logic level 1 from the memory device indicates that an associated non-volatile reference bit needs an additional program pulse.

15. The method of claim 11 wherein the memory device is a flash memory device.

16. The method of claim 11 wherein the program pulses are generated by a high voltage switch/pump of the memory device.

17. The method of claim 11 wherein the program pulses have an amplitude of 8 volts applied to the control gate, 5.4 volts applied to the drain, and ground level applied to the source.

18. The method of claim 17 wherein the program pulses are applied for a period of 1 ms.

19. The method of claim 11 wherein a drain connection of the reference bits are coupled to the associated bitlines.

* * * * *